United States Patent
Fujimoto et al.

(10) Patent No.: US 9,502,862 B2
(45) Date of Patent: Nov. 22, 2016

(54) LIGHT EMITTING ELEMENTS DRIVE CONTROL DEVICE, DROPLETS-DEPOSITED LAYER DRYING DEVICE, AND IMAGE FORMING APPARATUS

(71) Applicant: FUJI XEROX CO., LTD., Tokyo (JP)

(72) Inventors: Takashi Fujimoto, Kanagawa (JP); Chikaho Ikeda, Kanagawa (JP); Jun Isozaki, Kanagawa (JP); Akira Sakamoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 14/847,097

(22) Filed: Sep. 8, 2015

(65) Prior Publication Data

US 2016/0233643 A1 Aug. 11, 2016

(30) Foreign Application Priority Data

Feb. 10, 2015 (JP) ................................. 2015-023884

(51) Int. Cl.
*B41J 11/00* (2006.01)
*H01S 5/068* (2006.01)
*H01S 5/40* (2006.01)

(52) U.S. Cl.
CPC .......... *H01S 5/06804* (2013.01); *B41J 11/002* (2013.01); *H01S 5/06808* (2013.01); *H01S 5/4025* (2013.01)

(58) Field of Classification Search
CPC .......... B41J 11/002; B41J 2/45; B41J 2/455; B41J 2/447; B41J 2/473; G03G 15/043; G03G 15/0435; G03G 15/326; H01L 27/3269; H01S 5/06804; H01S 5/06808; H01S 5/0683; H01S 5/06837; H01S 5/062; H01S 5/06206; H01S 5/06222
See application file for complete search history.

(56) References Cited

U.S. PATENT DOCUMENTS 5,751,748 A * 5/1998 Uejima .................... B41J 2/473
    372/109
6,266,078 B1 * 7/2001 Koga ..................... G02B 26/123
    250/205

(Continued)

FOREIGN PATENT DOCUMENTS

JP    2006-059856    3/2006
JP    2007-329429    12/2007

(Continued)

OTHER PUBLICATIONS

Abstract and machine translation of JP 2006-059856.
Abstract and machine translation of JP 2008-124303.

(Continued)

*Primary Examiner* — Anh T. N. Vo
(74) *Attorney, Agent, or Firm* — Fildes & Outland, P.C.

(57) ABSTRACT

A light emitting elements drive control device includes: a detection unit that detects drive voltages and drive currents of a plurality of respective semiconductor light emitting elements arranged in a width direction of a recording medium; a calculation unit that calculates generated heat amounts of the respective semiconductor light emitting elements from heating-raised temperatures of the respective semiconductor light emitting elements determined based on the drive voltages and the drive currents detected by the detection unit, and calculates actual emission light quantities of the semiconductor light emitting elements from differences between the generated heat amounts of the semiconductor light emitting elements and input heat amounts corresponding to powers supplied to the semiconductor light emitting elements, respectively; and a correction unit that corrects differences between the actual emission light quantities of the semiconductor light emitting elements calculated by the calculation unit and required emission light quantities, respectively.

10 Claims, 10 Drawing Sheets

(56) References Cited

U.S. PATENT DOCUMENTS

| | | | |
|---|---|---|---|
| 7,268,797 B2 * | 9/2007 | Hata | H04N 1/4015 347/237 |
| 7,628,481 B2 * | 12/2009 | Kadomatsu | B41J 2/2114 347/101 |
| 7,728,862 B2 | 6/2010 | Kishimoto | |
| 8,425,030 B2 * | 4/2013 | Irita | B41J 2/2114 106/31.13 |
| 2007/0285491 A1 | 12/2007 | Kishimoto | |

FOREIGN PATENT DOCUMENTS

| | | |
|---|---|---|
| JP | 2008-124303 | 5/2008 |
| JP | 2010-067833 | 3/2010 |

OTHER PUBLICATIONS

Abstract and machine translation of JP 2010-067833.
Abstract and machine translation of JP 2007-329429.

* cited by examiner

LIGHT EMITTING ELEMENTS DRIVE CONTROL DEVICE, DROPLETS-DEPOSITED LAYER DRYING DEVICE, AND IMAGE FORMING APPARATUS

CROSS-REFERENCE TO RELATED APPLICATIONS

This application is based on and claims priority under 35 USC 119 from Japanese Patent Application No. 2015-023884 filed on Feb. 10, 2015.

BACKGROUND

1. Technical Field

The present invention relates to a light emitting elements drive control device, a droplets-deposited layer drying device, and an image forming apparatus.

2. Related Art

For example, to dry ink (formed by deposition of ink droplets) in forming an image by an inkjet printer, laser beams emitted from laser light emitting elements may be used. The light quantities of laser beams are controlled according to the degrees of drying of deposited ink through constant-current control.

SUMMARY

According to an aspect of the invention, there is provided a light emitting elements drive control device comprising: a detection unit that detects drive voltages and drive currents of plural respective semiconductor light emitting elements arranged in a width direction of a recording medium; a calculation unit that calculates generated heat amounts of the respective semiconductor light emitting elements from heating-raised temperatures of the respective semiconductor light emitting elements determined based on the drive voltages and the drive currents detected by the detection unit, and calculates actual emission light quantities of the semiconductor light emitting elements from differences between the generated heat amounts of the semiconductor light emitting elements and input heat amounts corresponding to powers supplied to the semiconductor light emitting elements, respectively; and a correction unit that corrects differences between the actual emission light quantities of the semiconductor light emitting elements calculated by the calculation unit and required emission light quantities, respectively.

BRIEF DESCRIPTION OF THE DRAWINGS

Exemplary embodiments of the present invention will be described in detail based on the following figures, wherein.

DESCRIPTION OF SYMBOLS

Figure 1:
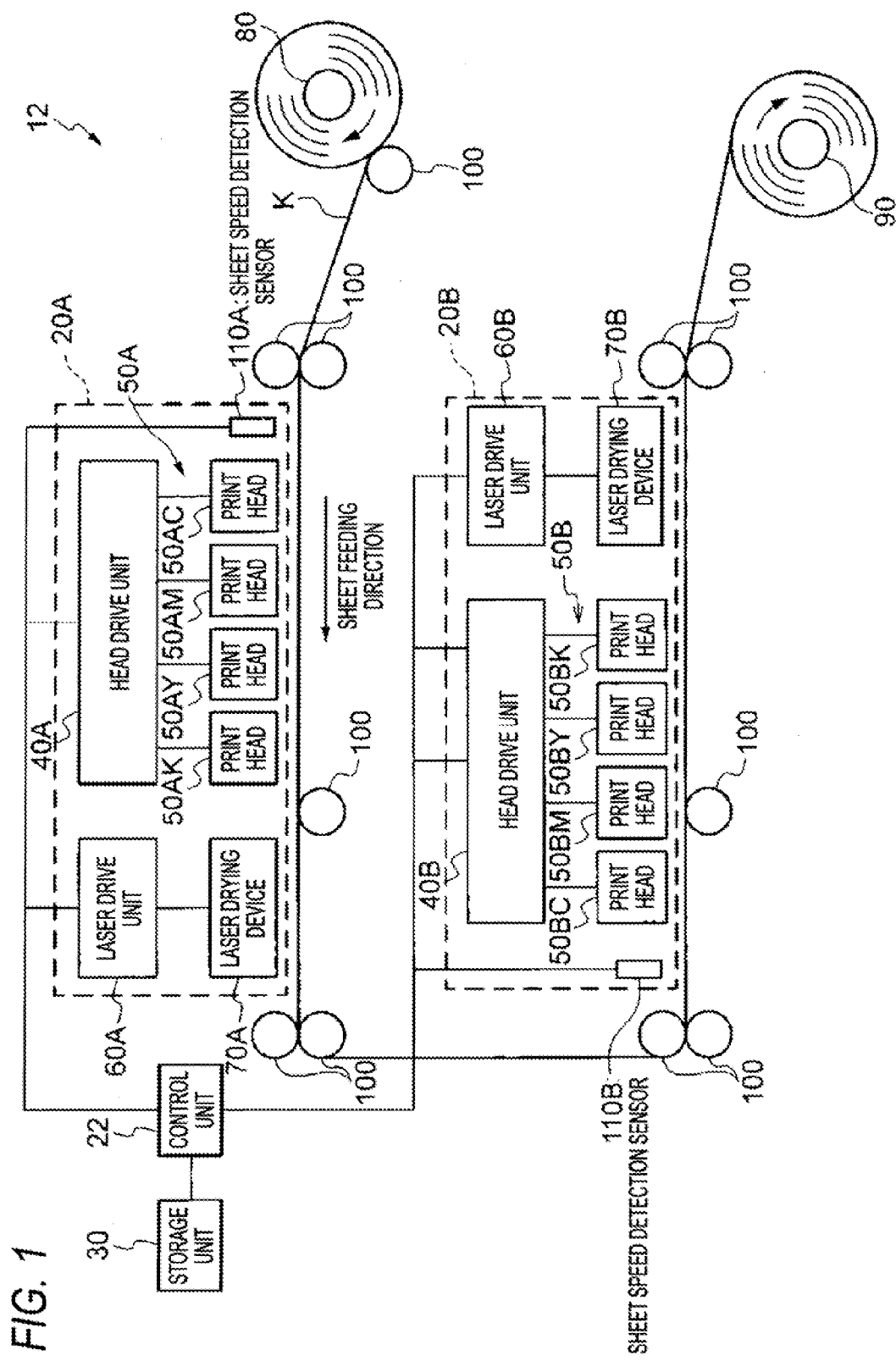
FIG. 1 is a schematic diagram showing a general configuration of a main part of an inkjet recording apparatus according to a first exemplary embodiment.

K: Sheet
12: Inkjet recording apparatus
20: Image forming unit
22: Control unit
30: Storage unit
40: Head drive unit
50: Print head
60: Laser drive unit
70: Laser drying device
72: Laser light emitting element
74: Laser light emitting element group
76: Light emitting portion
80: Sheet feed roll
90: Take-up roll
100: Feeding roller
110A, 110B: Sheet speed detection sensor
102: Light quantity calculating unit
104: Power source control unit
106: Voltage measuring unit
106A, 106B: Voltage measurement terminal
108: Current control unit
110: Current measuring unit
112: Voltage supply unit
114: Constant current source

DETAILED DESCRIPTION

Exemplary Embodiment 1

(Outline of Apparatus)

FIG. 1 is a schematic diagram showing a general configuration of a main part of an inkjet recording apparatus 12 according to a first exemplary embodiment. For example, the inkjet recording apparatus 12 is equipped with a pair of image forming units 20A and 20B, a control unit 22, a storage unit 30, a sheet feed roll 80, a take-up roll 90, and feeding rollers 100.

The image forming unit 20A includes, for example, a head drive unit 40A, print heads 50A, a laser drive unit 60A, a laser drying device 70A, and a sheet speed detection sensor 110A. Likewise, the image forming unit 20B includes, for example, a head drive unit 40B, print heads 50B, a laser drive unit 60B, a laser drying device 70B, and a sheet speed detection sensor 110B. In the following description, the suffixes "A" and "B" of the symbols denoting the image forming units 20A and 20B and the pairs of units included therein and corresponding to each other may be omitted when it is not necessary to discriminate between them.

The control unit 22 controls the rotation of the feeding rollers 100 which are connected to a sheet feeding motor (not shown) via a mechanism such as gears by controlling the sheet feeding motor. A sheet K (recording medium) which is long in the sheet feeding direction is wound on the sheet feed roll 80, and the sheet K is feeded in the sheet feeding direction as the feeding rollers 100 are rotated.

The control unit 22 acquires image information that is stored in, for example, the storage unit 30 and forms an image corresponding to the acquired image information on one image forming surface of the sheet K by controlling the image forming unit 20A on the basis of pixel-by-pixel color information contained in the image information.

More specifically, the control unit 22 controls the head drive unit 40A. The head drive unit 40A forms an image corresponding to image information on one image forming surface of the sheet K being fed by causing the print heads 50A (connected to the head drive unit 40A) to eject ink droplets by driving it according to ink droplets ejection timing specified by the control unit 22.

Color information of each pixel contained in image information includes information indicating a color of the pixel uniquely. Although the first exemplary embodiment assumes an example case that color information of each pixel of an image is represented by densities of yellow (Y), magenta (M), cyan (C), and black (K), another representation method for representing colors of an image uniquely may be employed.

The print heads 50A are four print heads 50AY, 50AM, 50AC, and 50AK corresponding to the four respective colors Y, M, C, and K, and eject ink droplets which are droplets of the respective colors. The drive method for causing the print heads 50A to eject ink droplets is not restricted to any particular method and may be any of known methods such as the thermal method and the piezoelectric method.

The laser drive unit 60A is equipped with switching elements such as FETs (field-effect transistors) for controlling the laser emission light quantities by controlling current or turning on/off laser light emitting elements 72 (see FIG. 2) provided in the laser drying device 70A, and drives the switching elements on the basis of instructions from the control unit 22. In the first exemplary embodiment, the laser light emitting elements 72 may be semiconductor lasers.

The control unit 22 causes the laser drying device 70A to emit laser light toward one image forming surface of the sheet K by controlling the laser drive unit 60A, and fixes an image formed on the sheet K by drying the ink of the image formed on the sheet K by generated heat (input heat) that depends on the quantities of laser light. The control unit 22 can increase the drying efficiency by performing laser irradiation on/off controls on the basis of the image information while maintaining drive currents. Alternatively, the magnitudes of drive currents may be controlled.

The distance between the laser drying device 70A and the sheet K is set according to the radiation angle of each laser light emitting element 72 and the size of an irradiation region.

The sheet K is then fed to the position where it is opposed to the image forming unit 20B as the feeding roller 100 are rotated. The sheet K is fed so that the image forming surface that is opposite to the one on which the image has been formed by the image forming unit 20A will be opposed to the image forming unit 20B.

The control unit 22 forms an image corresponding to image information on the other image forming surface of the sheet K by controlling the image forming unit 20B in the same manner as it controlled the image forming unit 20A. As such, the inkjet recording apparatus 12 is equipped with the pair of image forming units 20A and 20B so as to be capable of printing on both surfaces of a sheet K.

The sheet K is fed to the take-up roll 90 as the feeding roller 100 are rotated, and is taken up by the take-up roll 90.

Each of the sheet speed detection sensors 110A and 110B is disposed, for example, at such a position as to be opposed to the image forming surface of the sheet K, detects a feeding speed of the sheet K in the sheet feeding direction, and communicates it to the control unit 22.

Using the feeding speed of the sheet K acquired from each of the sheet speed detection sensors 110A and 110B, the control unit 22 controls the drive timing of the corresponding laser drive unit 60 so that the corresponding laser drying device 70 irradiates the sheet K with laser light with such timing that the ink that has been deposited on the sheet K reaches the laser light irradiation region of the laser drive unit 60.

The method by which each of the sheet speed detection sensors 110A and 110B detects a feeding speed of the sheet K is not restricted to any particular method and may be any of known methods. It is noted that the sheet speed detection sensors 110A and 110B are not indispensable in the inkjet recording apparatus 12 according to the first exemplary embodiment.

There are various kinds of inks such as water-based inks, oil-based inks whose solvents evaporate, ultraviolet-setting inks. The first exemplary embodiment assumes use of water-based inks. In the first exemplary embodiment, the terms "ink" and "ink droplets" mean water-based ink and water-based ink droplets unless otherwise specified.

(Laser Drying Device)

Figure 2:
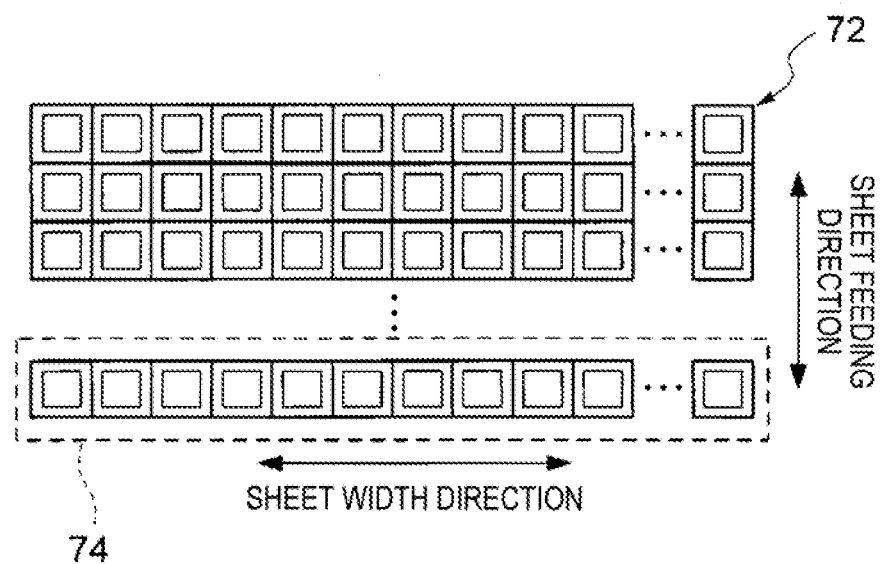
FIG. 2 shows an example laser light emission surface of each laser drying device according to the first exemplary embodiment.
Figure 2:
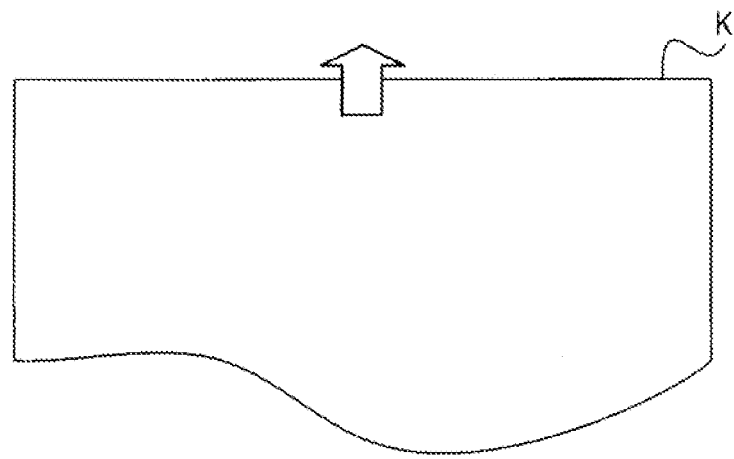

FIG. 2 shows an example laser light emission surface of each laser drying device 70. The laser light emission surface of each laser drying device 70 is a surface that is opposed to the image forming surface of the sheet K. As shown in FIG. 2, plural laser light emitting elements 72 are arranged on the laser light emission surface in lattice form in the sheet feeding direction and the sheet width direction which is perpendicular to the sheet feeding direction. The laser light emitting elements 72 are coupled to each other in a thermal sense.

In the first exemplary embodiment, a VCSEL (vertical cavity surface emitting laser) which is of a surface emission type is employed as each laser light emitting element 72. The number and the manner of arrangement, as shown in FIG. 2, of the laser light emitting elements 72 that are arranged on the laser light emission surface of the laser drying device 70 are just examples.

In the first exemplary embodiment, each row of laser light emitting elements 72 arranged in the sheet width direction which is a unit of light quantity control (constant-current control) of the corresponding laser drive unit 60 (see FIG. 1) is referred to as a laser light emitting element group 74.

In the arrangement shown in FIG. 2, plural laser light emitting element groups 74 each extending in the sheet width direction are arranged in the sheet feeding direction. Whereas in FIG. 2 each laser light emitting element group 74 covers the entire region in the sheet width direction, a series connection of plural laser light emitting element groups 74 may cover the entire region in the sheet width direction. The emission light quantities of the laser light emitting elements 72 or the plural laser light emitting element groups 74 are controlled according to image information, whereby drying can be performed efficiently and the energy consumption can be lowered.

Figure 4:
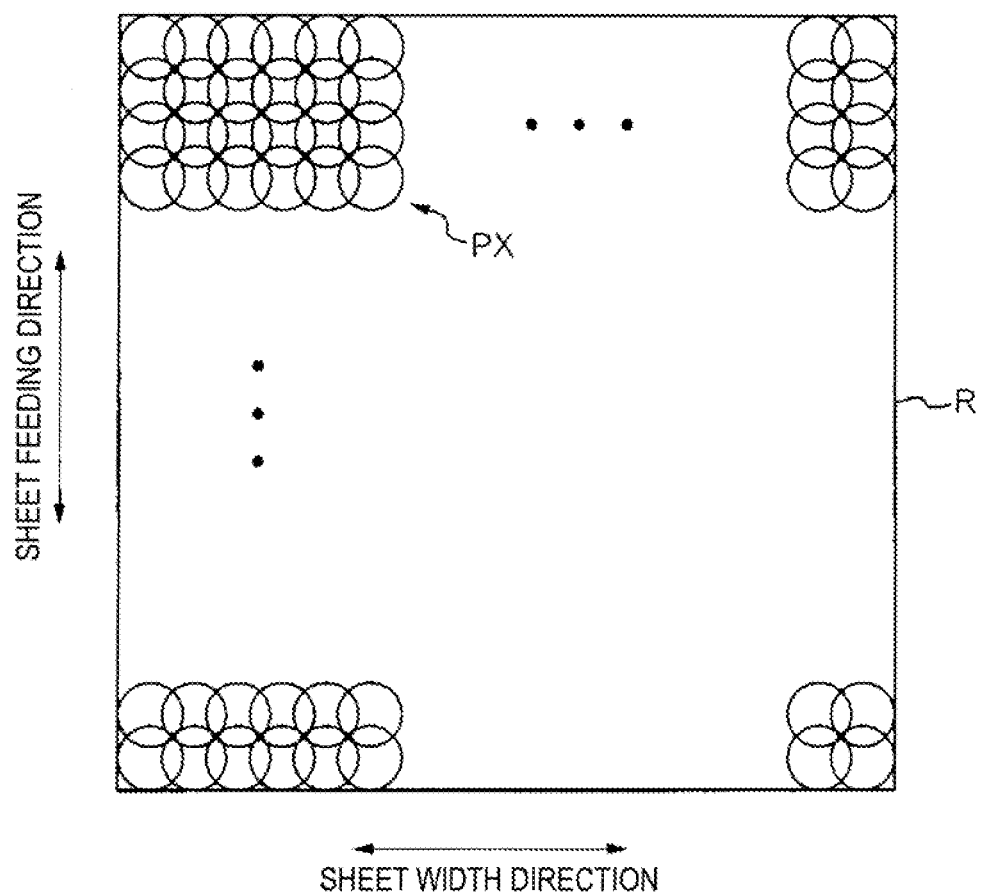
FIG. 4 shows an example laser light irradiation range of each laser light emitting element (VCSEL) employed in the first exemplary embodiment.

Next, a description will be made of a relationship between ink deposited on the sheet K and the laser light irradiation range of each laser light emitting element 72. FIG. 4 shows a laser light irradiation range R of each laser light emitting element 72.

As shown in FIG. 4, in each laser drying device 70 according to the first exemplary embodiment, the laser light irradiation range R of each laser light emitting element 72 is set so as to include plural ink droplets PX. For example, where the printing resolution of the print heads 50 is 1,200 dpi (dots per inch), the laser light irradiation range R is set so as to include 60 ink droplets PX in each of the sheet feeding direction and the sheet width direction. In this case, the laser light irradiation range R is a square that measures 1.27 mm in each of the sheet feeding direction and the sheet width direction. In this manner, each laser light emitting element 72 dries an ink layer formed by deposition of plural ink droplets PX.

(Drying Control)

Figure 5:
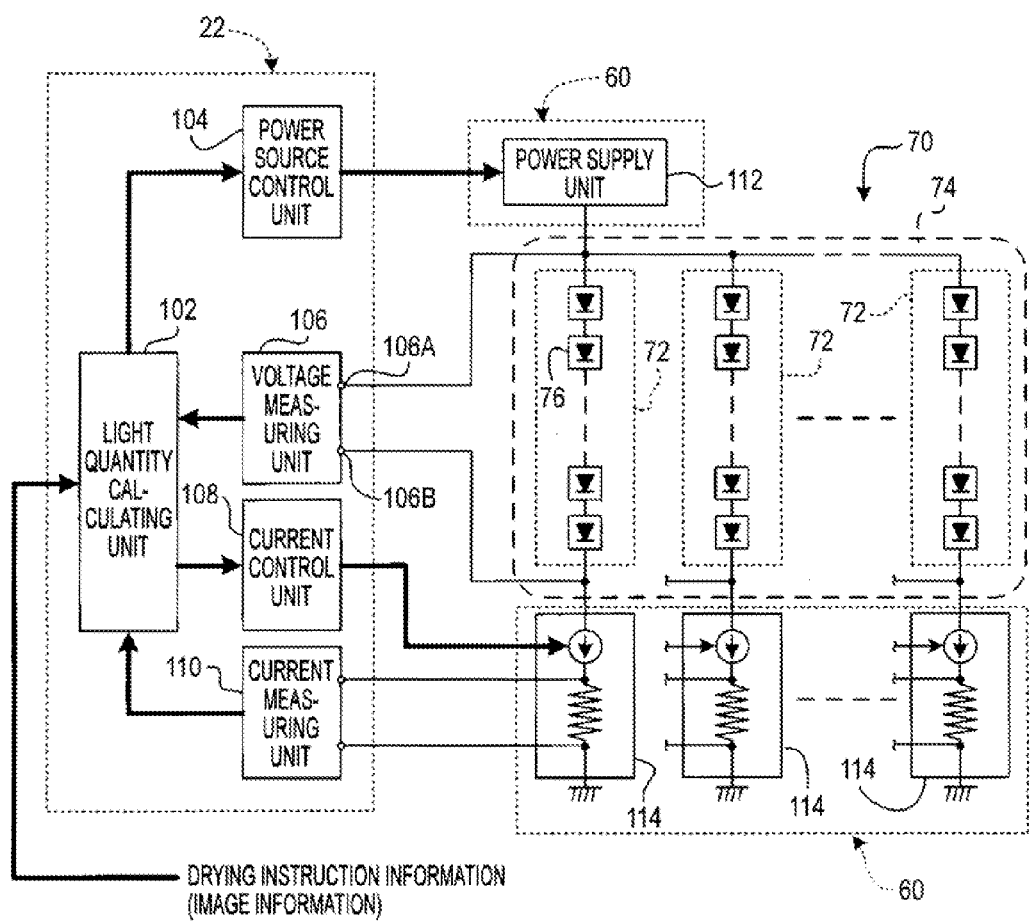
FIG. 5 is a block diagram illustrating a drying control function that is performed by a control unit on each set of a laser drive unit and a laser drying device in the first exemplary embodiment.

FIG. 5 is a block diagram illustrating a drying control function that is performed by the control unit 22 on each set of a laser drive unit 60 and a laser drying device 70. FIG. 5 shows functional blocks of a particular function (drying control function) of the control unit 22 and should not be construed as restricting its hardware configuration.

As shown in FIG. 5, the control unit 22 is equipped with a light quantity calculating unit 102 which functions as an example of a calculation unit (first calculation unit and second calculation unit), a determining unit, and a correction unit (current correcting unit); a power source control unit 104 which functions as an example of a unit that controls a voltage that is output from a power supply unit; a voltage measuring unit 106 which functions as an example of a detection unit; a current control unit 108 which functions as an example of a control unit; and a current measuring unit 110 which function as an example of the detection unit.

The cathode sides of the laser light emitting elements 72 are grounded via respective constant current sources 114 which operate independently of each other.

The power source control unit 104 controls each power supply unit 112 and thereby controls a voltage to be applied to the associated laser light emitting element group 74 and the constant current sources 114 connected to it in series by controlling.

Each power supply unit 112 applies a voltage to the associated laser light emitting element group 74 and the constant current sources 114 connected to it in series. In the configuration shown in FIG. 5, the power supply unit 112 is connected to the anode sides of the plural laser light emitting elements 72 constituting the laser light emitting element group 74 and the cathode sides of the laser light emitting elements 72 are connected the respective constant current sources 114. The power supply units 112 are provided for the respective laser light emitting element groups 74.

The anode side and the cathode side of each laser light emitting element 72 are connected to a pair of voltage measurement terminals 106A and 106B of the voltage measuring unit 106 of the control unit 22. The voltage measuring unit 106 measures an anode-cathode voltage (hereinafter may be referred to as an A-K voltage) of each laser light emitting element 72.

The current control unit 108 and the current measuring unit 110 of the control unit 22 are connected to each constant current source 114. The current measuring unit 110 measures a current that flows through each laser light emitting element 72. The current control unit 108 instructs each constant current source 114 on a drive current I (to flow through the laser light emitting element 72). Each constant current source 114 performs a constant-current control in such a manner that the A-K voltage is controlled so as to produce the specified drive current I.

The laser drying device 70 irradiates the sheet K being fed (see FIG. 2) with laser light and thereby dries ink using heat generated by the laser light (input heat). In doing so, for example, the light quantity calculating unit 102 calculates emission light quantities (P) of the laser light emitting elements 72 that are suitable for ink droplets ejection amounts corresponding to image information that was used for image formation and the constant current sources 114 perform constant-current controls.

As a result, theoretically, a drying operation is performed with generated heat amounts that are suitable for ink droplets ejection amounts. To suppress the power consumption, it is preferable that the voltage that is supplied from each power supply unit 112 be set at a minimum value that is necessary for stable constant-current driving of the laser light emitting elements 72.

(Current-Voltage Characteristic of Laser Light Emitting Element)

Figure 6:
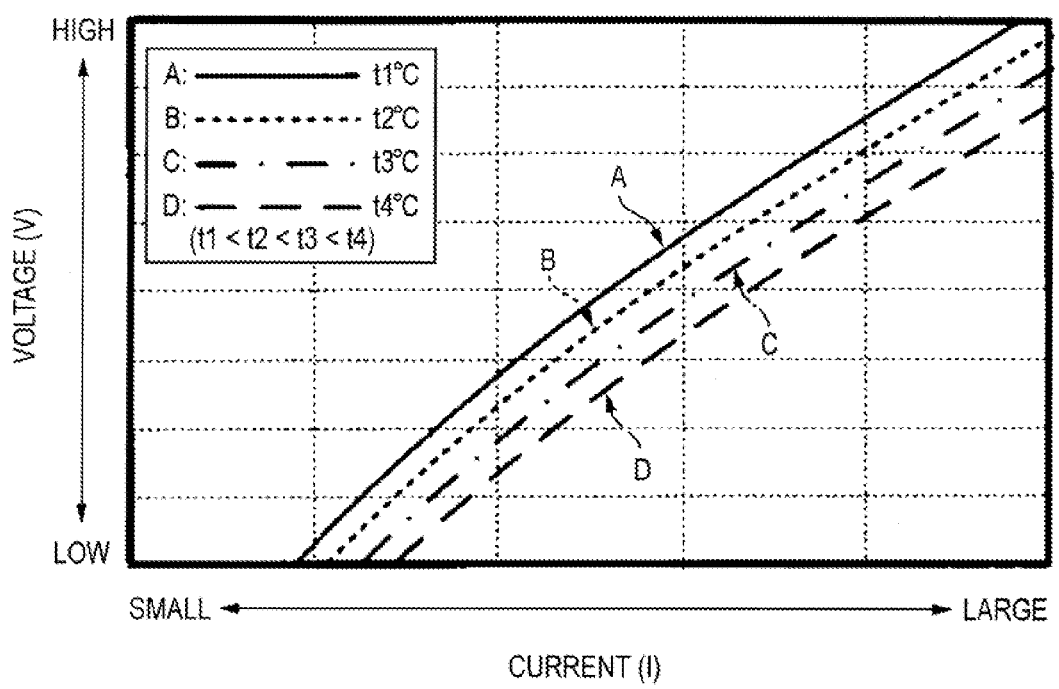
FIG. 6 is a current-voltage characteristic diagram of each laser light emitting element employed in the first exemplary embodiment.

In each laser light emitting element 72, as shown in FIG. 6, although the drive current I and the anode-cathode voltage V has a generally proportional relationship I=a*V+b (a, b: coefficients) in high current region, the coefficients a and b (in particular, b) vary due to heating of the laser light emitting element 72.

For example, it is seen from the characteristic diagram of FIG. 6 that even the current flowing through the laser light emitting element 72 is constant, the voltage decreases as its temperature (active layer temperature T; in FIG. 6, t1<t2<t3<t4) rises. The rate of this variation (temperature coefficient) is determined by the composition of a semiconductor that forms the laser light emitting element 72.

In other words, there are correlations between the drive current I, the A-K voltage V, and the active layer temperature T of the laser light emitting element 72. The first exemplary embodiment employs an example Equation (1) (approximate material-property-based equation). Using Equation (1), an accurate active layer temperature T can be determined on the basis of a drive current I and a voltage V.

$$V(T,I) = \alpha(T-T0) + (n \cdot k/q) \cdot T0 \cdot \log_e\{(I/I_s)+1\} + R_s \times I \tag{1}$$

where

V: anode-cathode voltage of the laser light emitting element 72;

I: drive current of the laser light emitting element 72;

T: active layer temperature T of the laser light emitting element 72;

α: temperature coefficient of voltage;
n: emission coefficient;
k: Boltzmann coefficient;
q: elementary charge;
$I_s$: reverse saturation current;
$R_s$: internal resistance; and
T0: reference temperature.

The first term α(T−T0) of the right side of Equation (1) represents a temperature characteristic and the other terms represent a voltage-current characteristic.

The light quantity calculating unit 102 (see FIG. 5) calculates an active layer temperature T according to Equation (1). This may be done either by an operation using the inverse function of Equation (1) or by constructing a computer program for determining a value of the active layer temperature T that satisfies Equation (1) by varying the active layer temperature T gradually. As a further alternative, relationships between the voltage V, the drive current I, and the active layer temperature T may be stored in advance in the form of a table.

The light quantity calculating unit 102 calculates emission light quantities on the basis of the active layer temperatures T calculated according to Equation (1).

Figure 7:
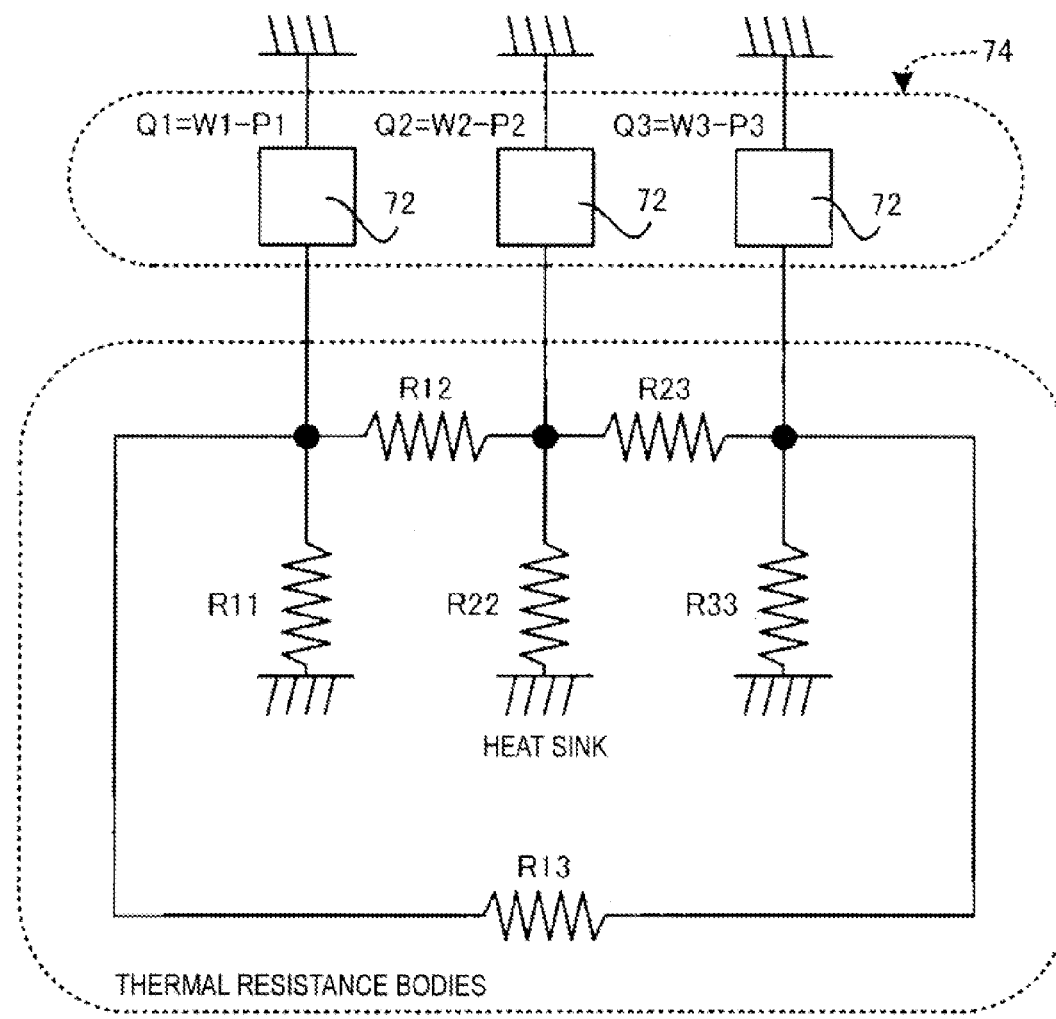
FIG. 7 is a thermal equivalent circuit of the laser light emitting elements in a case that three laser light emitting element are arranged in the sheet width direction as a laser light emitting element group in the first exemplary embodiment.

FIG. 7 is a thermal equivalent circuit of the laser light emitting elements 72 in a case that three laser light emitting element 72 are arranged in the sheet width direction as a laser light emitting element group 74. In this thermal equivalent circuit, thermal resistance bodies $R_{nm}$ (n, m=1, 2, 3 (matrix)) are connected blocks representing generated heat amounts ($Q_1$, $Q_2$, $Q_3$) of the respective laser light emitting elements 72 and a heat sink. The thermal resistance values of the respective thermal resistance bodies $R_{nm}$ can be measured in advance.

With this thermal equivalent circuit, correlations between the active layer temperatures ($T_1$, $T_2$, $T_3$) of the respective laser light emitting elements 72 (calculated according to Equation (1)), the thermal resistance values of the respective thermal resistance bodies $R_{nm}$, and the generated heat amounts ($Q_1$, $Q_2$, $Q_3$) of the respective laser light emitting elements 72 are given by the following Equation (2):

$$\begin{bmatrix} T_1 \\ T_2 \\ T_3 \end{bmatrix} = \begin{bmatrix} R_{11} & R_{12} & R_{13} \\ R_{12} & R_{22} & R_{23} \\ R_{13} & R_{23} & R_{33} \end{bmatrix} \begin{bmatrix} Q_1 \\ Q_2 \\ Q_3 \end{bmatrix} = Z \begin{bmatrix} Q_1 \\ Q_2 \\ Q_3 \end{bmatrix} \quad (2)$$

The following Equation (3) is obtained by modifying Equation (2):

$$\begin{bmatrix} Q_1 \\ Q_2 \\ Q_3 \end{bmatrix} = Z^{-1} \begin{bmatrix} T_1 \\ T_2 \\ T_3 \end{bmatrix} \quad (3)$$

Since the input powers ($W_1$, $W_2$, $W_3$) are the sums of the generated heat amounts ($Q_1$, $Q_2$, $Q_3$) and the emission light quantities ($P_1$, $P_2$, $P_3$), respectively, their correlations are given by the following Equation (4):

$$\begin{bmatrix} V_1 \times I_1 \\ V_2 \times I_2 \\ V_3 \times I_3 \end{bmatrix} = \begin{bmatrix} W_1 \\ W_2 \\ W_3 \end{bmatrix} = \begin{bmatrix} Q_1 + P_1 \\ Q_2 + P_2 \\ Q_3 + P_3 \end{bmatrix} \quad (4)$$

The following Equation (5) is obtained by modifying Equation (4):

$$\begin{bmatrix} P_1 \\ P_2 \\ P_3 \end{bmatrix} = \begin{bmatrix} W_1 - Q_1 \\ W_2 - Q_2 \\ W_3 - Q_3 \end{bmatrix} \quad (5)$$

Proper emission light quantities P (in this example, ($P_1$, $P_2$, $P_3$)) in which thermal losses corresponding to the active layer temperatures T (in this example, ($T_1$, $T_2$, $T_3$)) are taken into consideration are calculated according to Equation (5). The light quantity calculating unit 102 calculates drive currents I for producing the emission light quantities P and gives the current control unit 108 instructions indicating the calculated drive currents I. The current control unit 108 controls the constant current sources 114 to perform constant-current controls on the basis of the drive currents I specified by the light quantity calculating unit 102.

Figure 8:
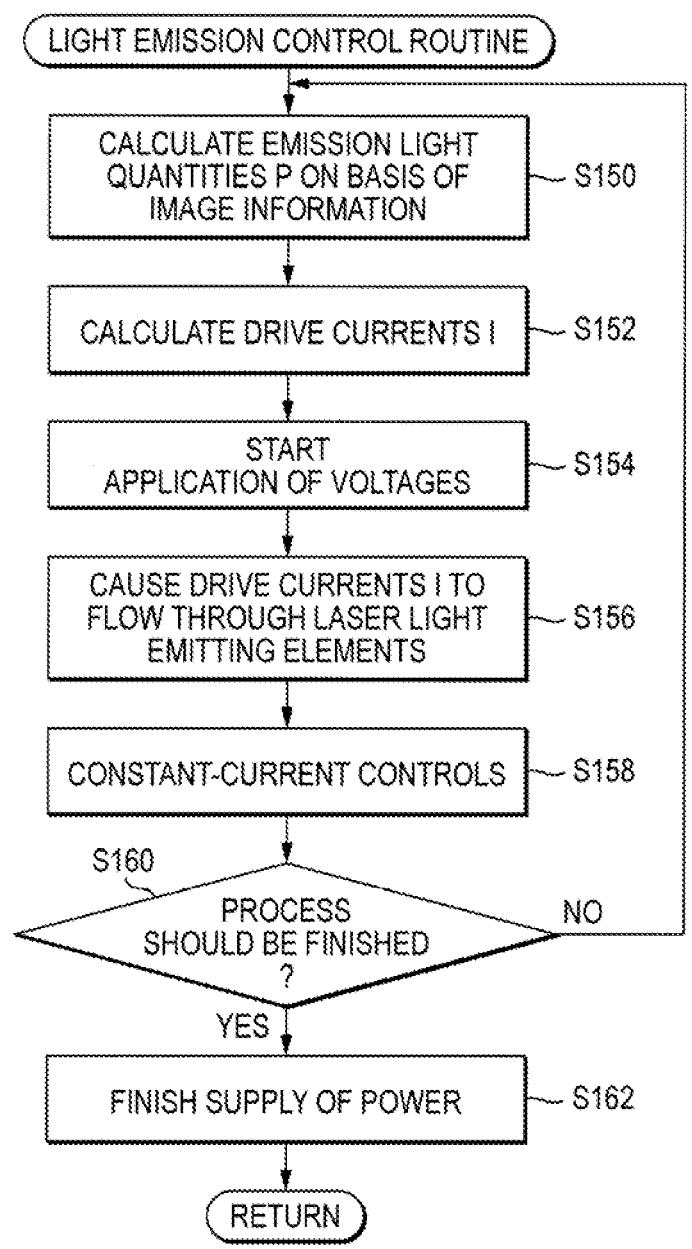
FIG. 8 is a flowchart of a light emission control routine that a light quantity calculating unit of the control unit according to the first exemplary embodiment follows.

A description will now be made of how the inkjet recording apparatus 12 according to the first exemplary embodiment works. FIG. 8 is a flowchart of a light emission control routine that the light quantity calculating unit 102 of the control unit 22 according to the first exemplary embodiment follows.

Upon arrival of a time for drying by the laser drying device 70, first, at step S150, light emission quantities P are calculated on the basis of image information. At step S152, drive currents I are calculated. Drive currents I that are set at step S152 are initial values (correction of drive currents I is performed at step S158 (described later)), and emission light quantities that are produced when the initial value drive currents I are caused to flow need not always coincide with the calculated light emission quantities P. One method for calculating drive currents I from the light emission quantities P is to set pre-extracted representative values of the voltages V and the active layer temperatures T in Equations (1)-(5) determined in advance.

At step S154, each power supply unit 112 of the laser drive unit 60 is driven by controlling the power source control unit 104, whereby a predetermined voltage is applied to the laser light emitting elements 72 and the constant current sources 114.

At step S156, the drive currents I that were calculated at step S152 are caused to flow through the respective laser light emitting elements 72 by driving the constant current sources 114 by controlling the current control unit 108. In response, the laser light emitting elements 72 emit light beams to irradiate the sheet K being fed and to thereby perform ink drying.

At step S158, constant-current controls (drive currents I) are performed by the constant current sources 114. The currents flowing through the respective laser light emitting elements 72 are kept constant by the constant-current controls, whereby a stable drying operation with no incomplete or excessive drying is performed. The details of the constant-current controls of step S158 will be described later with reference to FIG. 9.

At step S160, it is judged whether to complete the process, that is, whether or not the region to be subjected to drying of the sheet K has passed the laser drying device 70. If the judgment result is negative (i.e., a region to be subjected to drying remains in the sheet K), the process returns to step S150 to execute the above steps again.

If the judgment result of step S160 is affirmative (Yes) (i.e., the region to be subjected to drying of the sheet K has passed the laser drying device 70), the process moves to step S162, where the constant current sources 114 shut off the currents and the power supply units 112 stops the application of the voltages. Thus, the execution of this process is finished.

Figure 9:
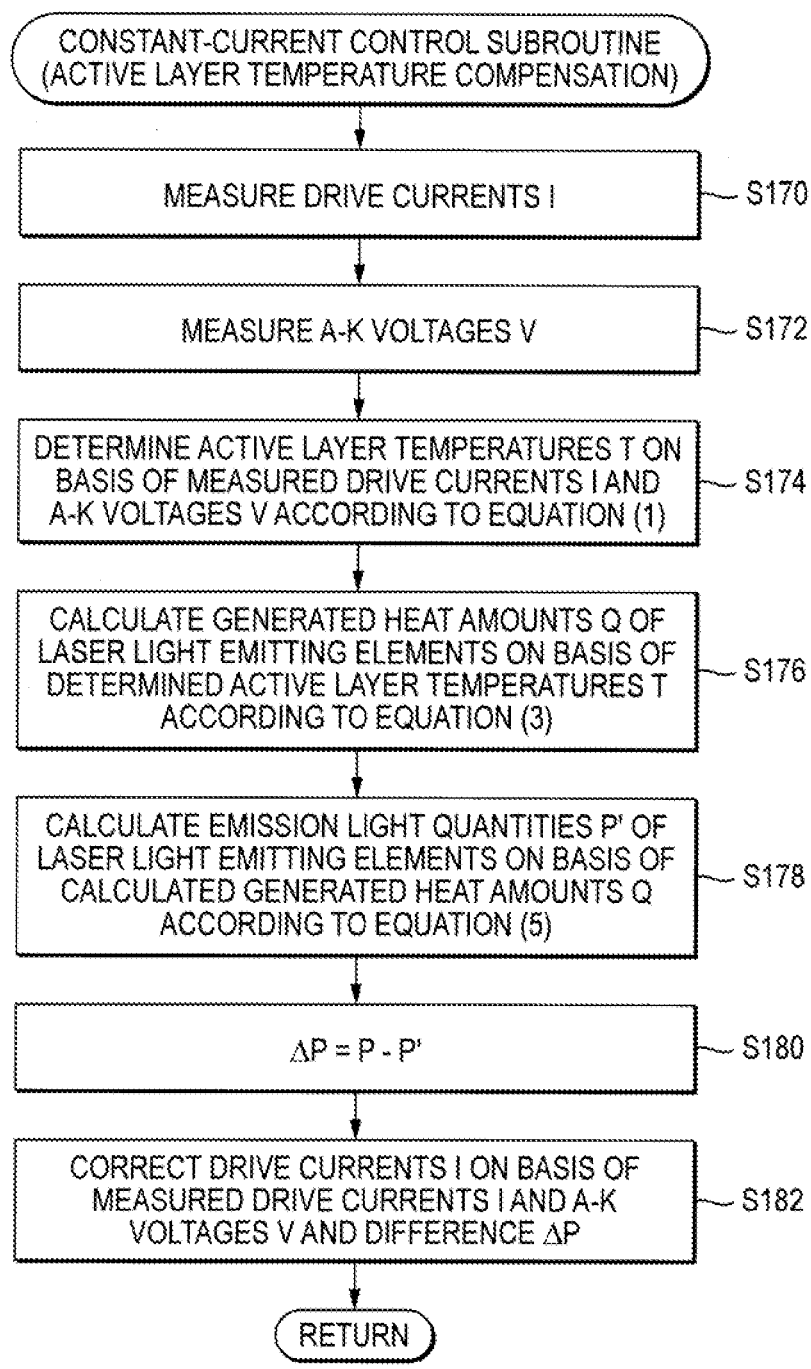
FIG. 9 is a flowchart of a detailed subroutine of the constant-current controls that are performed at step S158 shown in FIG. 8.

FIG. 9 is a flowchart of a detailed subroutine of the constant-current controls that are performed at step S158 shown in FIG. 8.

At step S170, the current measuring unit 110 measures drive currents I. At step S172, the voltage measuring unit 106 measures A-K voltages V.

At step S174, active layer temperatures T of the respective laser light emitting elements 72 are determined on the basis of the measured drive currents I and A-K voltages V according to Equation (1).

In the first exemplary embodiment, active layer temperatures T can be determined according to Equation (1) by any of the following methods:

Determining method-1 (operation): Each active layer temperature T is calculated by an operation using the inverse function of Equation (1).

Determining method-2 (loop processing): A computer program for determining a value of each active layer temperature T that satisfies Equation (1) by varying the active layer temperature T gradually is run.

Determining method-3 (table reference): Relationships between the voltage V, the drive current I, and the active layer temperature T are stored in advance in the form of a table, and a proper value of the active layer temperature T is extracted from the table.

Although the determining method-1 to the determining method-3 have been described above, the method for determining each active layer temperature T according to Equation (1) is not limited to them.

At step S176, generated heat amounts Q of the laser light emitting elements 72 are calculated on the basis of the respective active layer temperatures T determined at step S174, according to Equation (3).

At step S178, emission light quantities P' of the laser light emitting elements 72 are calculated on the basis of the respective generated heat amounts Q calculated at step S176, according to Equation (5).

At step S180, differences ΔP between the currently specified emission light quantities P (calculated at step S150 shown in FIG. 8) and the emission light quantities P' calculated at step S178 are calculated, respectively. The differences ΔP mean differences between the necessary emission light quantities and the actual ones.

At step S182, the drive currents I for the constant-current controls by the constant current sources 114 are corrected on the basis of the drive currents I measured at step S170, the A-K voltages V measured at step S172, and the emission light quantity differences ΔP calculated at step S180. Thus, the execution of this process is finished.

Exemplary Embodiment 2

A second exemplary embodiment relates to an example structure of the laser light emission surface of each laser light emitting element 72 which is applicable to the first exemplary embodiment. The other part of the configuration of the second exemplary embodiment is the same as that of the first exemplary embodiment. Therefore, only differences from the first exemplary embodiment will be described below.

Figure 3:
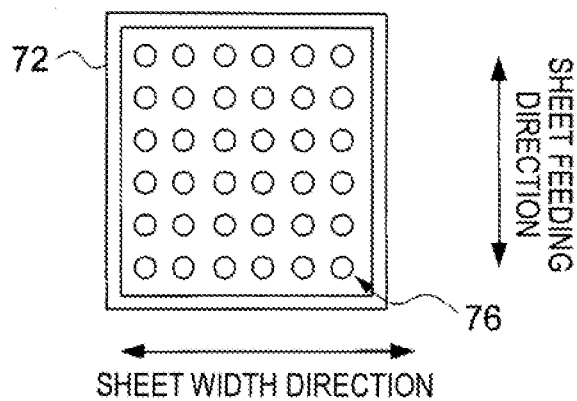
FIG. 3 shows an example laser light emission surface of each laser light emitting element (VCSEL) according to a second exemplary embodiment.

FIG. 3 shows an example laser light emission surface of each laser light emitting element (VCSEL) 72. Like the laser light emission surface of the laser drying device 70, the laser light emission surface of each laser light emitting element 72 is a surface that is opposed to the image forming surface of the sheet K.

Plural light emitting portions (dies) 76 are arranged on the laser light emission surface of each laser light emitting element 72 in lattice form in the sheet feeding direction and the sheet width direction, and each light emitting portion 76 emits laser light with timing that is determined by an on/off control of the laser light emitting element 72. The number and the manner of arrangement of the light emitting portions 76 that are arranged in each laser light emitting element 72 as shown in FIG. 3 are just examples.

The plural light emitting portions (dies) 76 may be connected to each other in series, in parallel, or in series and parallel.

Exemplary Embodiment 3

A third exemplary embodiment relates to an example calculation unit which is applicable to the first and second exemplary embodiments. The other part of the configuration of the third exemplary embodiment is the same as that of each of the first and second exemplary embodiments. Therefore, only differences from the first and second exemplary embodiments will be described below.

In one calculation method, in addition to voltages V and drive currents I, light emission wavelengths and light quantities P of respective laser light emitting elements 72 (they are characteristic values of the laser light emitting elements 72) are measured before installation, at an initial stage of installation, or at the time of maintenance of the light emitting elements drive control device. And equations indicating the relationships between these characteristic parameters are determined. This makes it possible to calculate a light quantity P on the basis of a voltage V and a drive current I. More specifically, since an active layer temperature can be known from a variation in light emission wavelength, it is possible to calculate generated heat amounts Q by subtracting light quantities P from input powers W calculated from drive currents I and voltages V and then calculate thermal resistances from the active layer temperatures T and the generated heat amounts Q. A heat capacity can be obtained by determining variations of the respective characteristic parameters when the drive current I varies in rectangular form.

Even when the laser light emitting elements 72 have deteriorated, neither the equation indicating the relationships between their voltage V, drive current I, and active layer temperature T nor the thermal resistances of the thermal equivalent circuit and the heat capacities vary. Therefore, by measuring voltages V and drive currents I, active layer temperatures T can be calculated using the equation that was available before the deterioration. Generated heat amounts Q can be calculated from the active layer temperatures T, and emission light quantities P can be calculated from the generated heat amounts Q and the input powers W.

In another calculation method, where each laser light emitting element 72 is formed by plural dies, an equation indicating relationships between the voltage V, the drive current I, and the active layer temperature T is formulated in advance by measuring voltages V, drive currents I, and light emission wavelengths of a single die of each laser light emitting element 72. An equation indicating relationships between the voltage V, the drive current I, and the active layer temperature T of the laser light emitting element 72 formed by the plural dies is estimated from the equation formulated above, and an active layer temperature T is calculated on the basis of a voltage V and a current I using the thus-estimated equation. The thus-calculated active layer temperatures T is represented by T1.

Then, an equation relating to the thermal resistance and, if necessary, an equation relating to the heat capacity are formulated in advance on the basis of light quantities P, active layer temperatures T, and input powers W of a single die. An equation indicating relationships between the active layer temperature T, the light quantity P, and the input power W of each laser light emitting element 72 formed as plural dies is estimated from the equation(s) formulated above. A generated heat amount Q is calculated from a difference between a measured light quantity P and an input power W calculated on the basis of a voltage V and a current I of the laser light emitting element 72, and an active layer temperature T is calculated from the generated heat amounts Q. The thus-calculated active layer temperature T is represented by T2.

A light quantity P can be calculated on the basis of a voltage V and a drive current I by determining the equation indicating relationships between the characteristic parameters by a method of adjusting and determining the coefficients of the equation indicating the relationships between the voltage V, the drive current I, the active layer temperature T, the thermal resistance, the heat capacity (if necessary), and the coefficients so that the difference between the active layer temperatures T1 and T2 is minimized (it is attempted to equalize the active layer temperatures T1 and T2) when the drive current I are swept over, for example, a rated current range.

In either method, the coefficients do not vary even if the laser light emitting elements 72 deteriorate except for the failure caused by artificial operation. Therefore, once the coefficients are calibrated at the beginning, light quantities P can be predicted accurately using coefficient values that were available before deterioration without the need for installing an optical system dedicated to light quantity measurement, even if the light emission efficiency lowers as a result of the deterioration.

In the first to third exemplary embodiments, a function may be added which restricts the drive current I depending on whether or not the calculated active layer temperature T is within a normal temperature range in correcting the drive current I at step S182 shown in FIG. 9.

Figure 10:
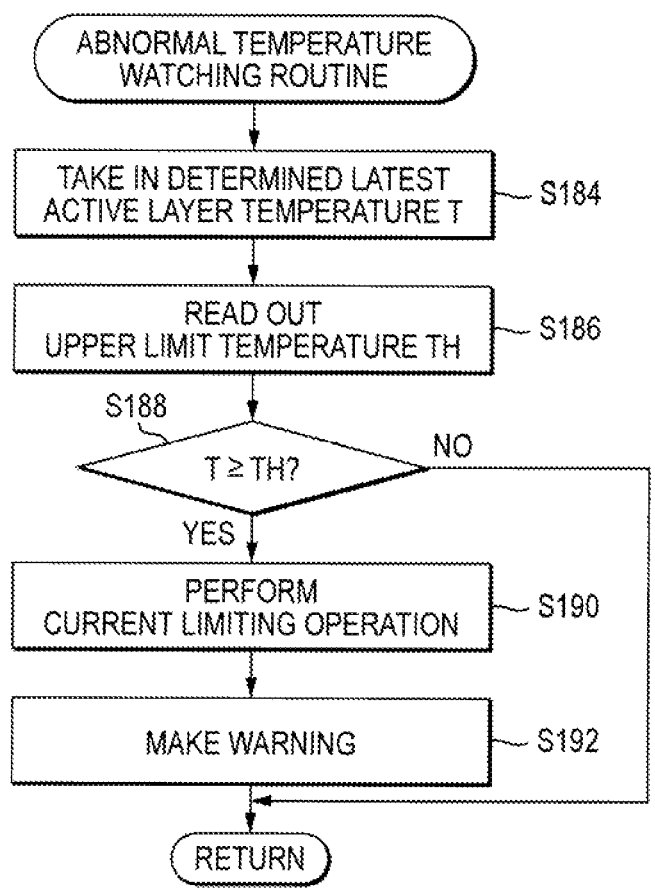
FIG. 10 is a flowchart of a temperature compensation control routine for each laser light emitting element which is followed in each of the first to third exemplary embodiments.

FIG. 10 is a flowchart of an abnormal temperature watching routine for the active layer temperature T of each laser light emitting element 72. This routine is followed after step S182 shown in FIG. 9.

At step S184, the active layer temperature T that was determined at step S174 shown in FIG. 9 is taken in. At step S186, a predetermined upper limit temperature TH is read out.

At step S188, the determined active layer temperature T is compared with the predetermined upper limit temperature TH. If it is judged at step S188 that T is lower than TH (i.e., the upper limit temperature TH is not exceeded), the execution of this process is finished. If it is judged that T is higher than or equal to TH (i.e., the upper limit temperature TH is exceeded), the process returns to step S190.

At step S190, an operation of restricting the current of the constant-current control is performed. At step S192, a warning operation is performed; for example, a message or the like announcing that current restriction is being made is displayed on a monitor of the inkjet recording apparatus 12 or an alarm sound is emitted. Then the execution of this process is finished.

In each of the first to third exemplary embodiments, the emission light quantities of the laser light emitting elements 72 are basically constant in the width direction of the sheet K. However, as shown in part (A) of FIG. 11, there may occur an image having different densities (ink amounts) in the width direction of the sheet K.

Figure 11:
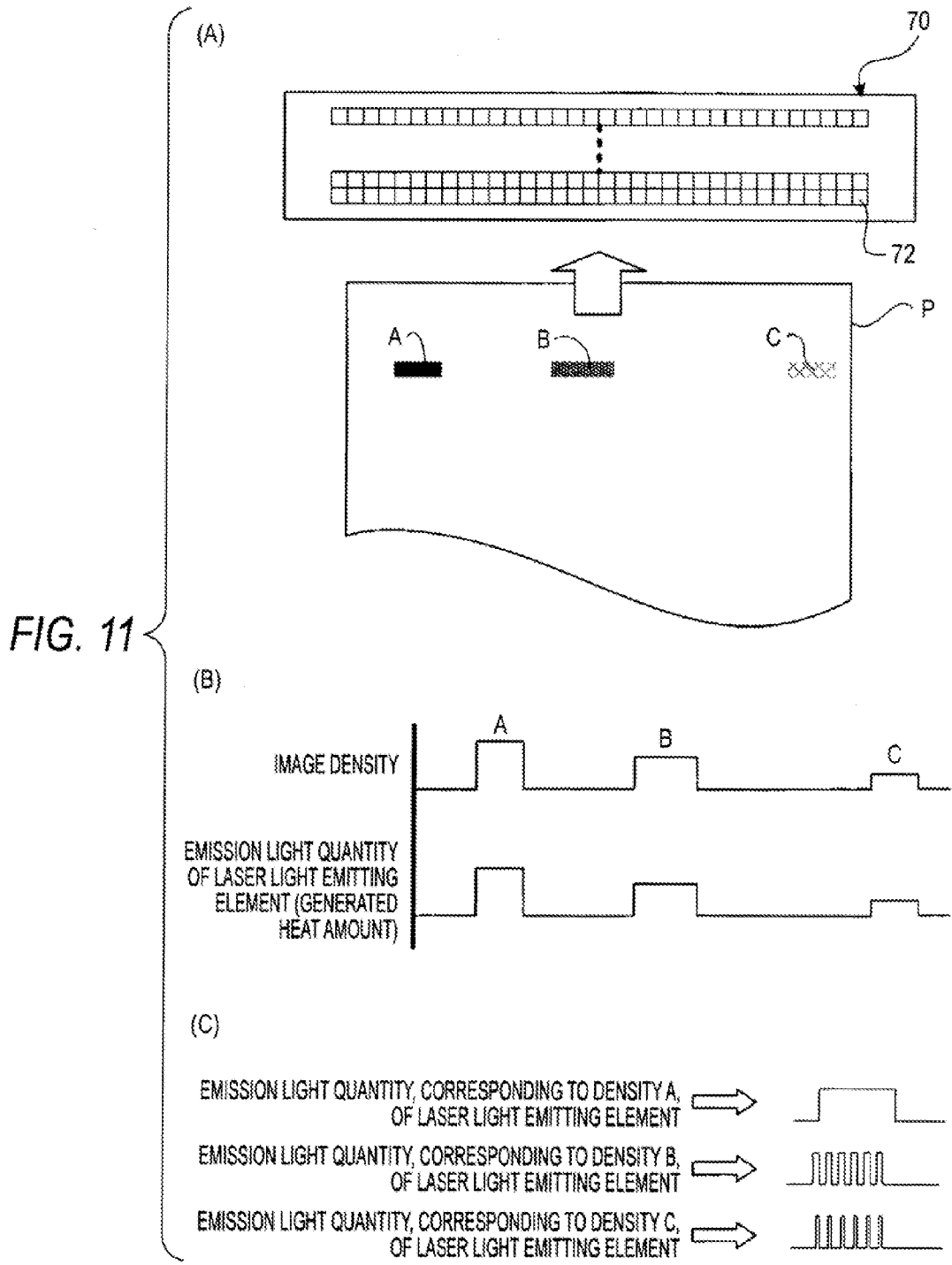
FIG. 11 is that part (A) of FIG. 11 is a schematic diagram showing an operation that the light emission quantities are controlled according to respective densities of an image formed on the sheet, part (B) of FIG. 11 shows a relationship between the image densities and light emission quantities of the respective laser light emitting element in the sheet width direction, and part (C) of FIG. 11 shows how generated heat amounts corresponding to the respective image densities are obtained by setting light emission quantities by a duty ratio control.

In such a case, as shown in part (B) of FIG. 11, the emission light quantities of the confronting laser light emitting elements may be adjusted according to image densities (ink amounts).

Different emission light quantities may be produced by setting different current values of the constant-current controls. Alternatively, as shown in part (C) of FIG. 11, by employing a duty ratio control (i.e., a pulse width control of the light emission time), emission light quantities (generated heat amounts) corresponding to respective image densities can be produced without setting different current values of the constant-current controls.

In each of the first to third exemplary embodiments, in addition to the constant-current control using a specified drive current I, a difference ΔP between a specified light emission quantity P and an actual light emission quantity P' is obtained by causing the light emission quantity of each laser light emitting element 72 (which deteriorates with age) to reflect a variation of its active layer temperature T and the drive current I of the constant-current control is corrected on the basis of the difference ΔP.

In particular, by causing the light emission quantity of each laser light emitting element 72 to reflect a variation of its active layer temperature T, it becomes possible to maintain emission light quantities that are necessary and sufficient for drying of a sheet K.

In each of the first to third exemplary embodiments, each laser light emitting element group 74 is defined as a collection of laser light emitting elements 72 to which a voltage is applied from a common power supply unit 112, and laser light emitting element groups 74 are arranged in the width direction and the feeding direction of the sheet K. However, it suffices that at least one laser light emitting element group 74 exist in the width direction of the sheet K if the light emission quantities are so large that the droplets can be dried.

In each of the first to third exemplary embodiments, the laser light emitting elements drive control is applied to the laser light emitting elements 72 which are used in each laser drying device 70 of the inkjet recording apparatus 12. However, the application range of the invention is not limited to inkjet recording apparatus but encompasses drying devices in general which dry a droplets-deposited layer by heat that is generated by light emitted from laser light emitting devices.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. A light emitting elements drive control device comprising:
   a detection unit that detects drive voltages and drive currents of a plurality of respective semiconductor light emitting elements arranged in a width direction of a recording medium;
   a calculation unit that calculates generated heat amounts of the respective semiconductor light emitting elements from heating-raised temperatures of the respective semiconductor light emitting elements determined based on the drive voltages and the drive currents detected by the detection unit, and calculates actual emission light quantities of the semiconductor light emitting elements from differences between the generated heat amounts of the semiconductor light emitting elements and input heat amounts corresponding to powers supplied to the semiconductor light emitting elements, respectively; and
   a correction unit that corrects differences between the actual emission light quantities of the semiconductor light emitting elements calculated by the calculation unit and required emission light quantities, respectively.

2. The light emitting elements drive control device according to claim 1, further comprising:
   a power supply unit that supplies power to a group of the semiconductor light emitting elements; and
   a current control unit that controls currents to flow through the respective semiconductor light emitting elements,
   wherein the correction unit comprises a commanding unit that commands a voltage that the power supply unit is to apply and target currents of the current control unit.

3. The light emitting elements drive control device according to claim 2, wherein the calculation unit employs relationships between pre-detected voltages, currents, actual emission light quantities, and heating-raised temperatures of the respective semiconductor light emitting elements being driven, the relationships being consistent with a material-property-based equation that is based on a composition of the semiconductor light emitting elements and a material-property-based equation that is based on a thermal equivalent circuit.

4. The light emitting elements drive control device according to claim 3, wherein each of the semiconductor light emitting elements is a multiple laser in which a plurality of dies that are arranged at such intervals as to be able to be coupled to each other thermally are electrically connected to each other in series or in parallel.

5. The light emitting elements drive control device according to claim 2, wherein each of the semiconductor light emitting elements is a multiple laser in which a plurality of dies that are arranged at such intervals as to be able to be coupled to each other thermally are electrically connected to each other in series or in parallel.

6. A droplets-deposited layer drying device comprising:
   a plurality of semiconductor light emitting elements arranged in a width direction of a recording medium; and
   the light emitting elements drive control device according to claim 1.

7. An image forming apparatus comprising:
   an image forming unit that forms a droplets-deposited layer as an image corresponding to image information on a recording medium by ejecting droplets according to the image information; and
   the droplets-deposited layer drying device according to claim 6 that dries the droplets-deposited layer formed on the recording medium by the image forming unit.

8. A light emitting elements drive control device comprising:
   a detection unit that detects drive voltages and drive currents of a plurality of respective semiconductor light emitting elements arranged in a width direction of a recording medium;
   a calculation unit that calculates generated heat amounts of the respective semiconductor light emitting elements from heating-raised temperatures of the respective semiconductor light emitting elements determined based on the drive voltages and the drive currents detected by the detection unit, and calculates actual emission light quantities of the semiconductor light emitting elements from differences between the generated heat amounts of the semiconductor light emitting elements and input heat amounts corresponding to powers supplied to the semiconductor light emitting elements, respectively; and
   a correction unit that corrects differences between the actual emission light quantities of the semiconductor light emitting elements calculated by the calculation unit and required emission light quantities, respectively;
   wherein the calculation unit employs relationships between pre-detected voltages, currents, actual emission light quantities, and heating-raised temperatures of the respective semiconductor light emitting elements being driven, the relationships being consistent with a material-property-based equation that is based on a composition of the semiconductor light emitting elements and a material-property-based equation that is based on a thermal equivalent circuit.

9. The light emitting elements drive control device according to claim 8, wherein each of the semiconductor light emitting elements is a multiple laser in which a plurality of dies that are arranged at such intervals as to be able to be coupled to each other thermally are electrically connected to each other in series or in parallel.

10. A light emitting elements drive control device comprising:
   a detection unit that detects drive voltages and drive currents of a plurality of respective semiconductor light emitting demerits arranged in a width direction of a recording medium;
   a calculation unit that calculates generated heat amounts of the respective semiconductor light emitting elements from heating-raised temperatures of the respective semiconductor light emitting elements determined based on the drive voltages and the drive currents detected by the detection unit, and calculates actual emission light quantities of the semiconductor light emitting elements from differences between the generated heat amounts of the semiconductor light emitting elements and input heat amounts corresponding to powers supplied to the semiconductor light emitting elements, respectively; and
   a correction unit that corrects differences between the actual emission light quantities of the semiconductor light emitting elements calculated by the calculation unit and required emission light quantities, respectively;

wherein each of the semiconductor light emitting elements is a multiple laser in which a plurality of dies that are arranged at such intervals as to be able to be coupled to each other thermally are electrically connected to each other in series or in parallel.

* * * * *